TRANSISTOR OSCILLATOR FREQUENCY CONTROL

Filed Jan. 4, 1956

INVENTORS
GEORGE C. UCHRIN
HANS K. ZIEGLER
BY
Harry M. Saragovitz
ATTORNEY

United States Patent Office 2,854,580
Patented Sept. 30, 1958

2,854,580

TRANSISTOR OSCILLATOR FREQUENCY CONTROL

George C. Uchrin, Eatontown, and Hans K. Ziegler, Elberon, N. J., assignors to the United States of America as represented by the Secretary of the Army Application January 4, 1956, Serial No. 557,427

4 Claims. (Cl. 250—36)

Figure 1:
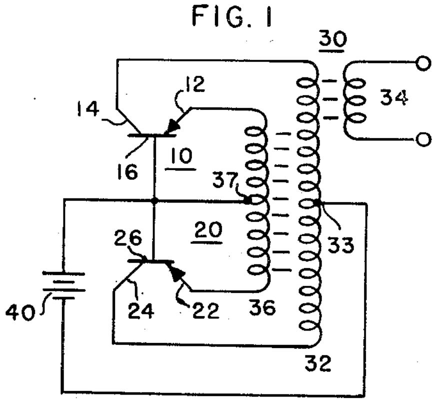

(Granted under Title 35, U. S. Code (1952), sec. 266)

The invention described herein may be manufactured and used by or for the Government for governmental purposes, without the payment of any royalty thereon.

The subject invention relates to oscillators and particularly to oscillators producing square waves. More particularly this invention relates to a push-pull saturable core transistor oscillator for generating square waves. More particularly this invention relates to a push-pull saturable core transistor oscillator for generating square waves and means for controlling the frequency of the oscillator. More particularly this invention relates to a means for controlling the frequency of a saturable core push-pull transistor oscillator.

The prior art teaches many types of oscillators actuated by vacuum tubes and, more recently, by transistors. Some of these oscillators are connected in push-pull. Most of these oscillators include capacitive coupling of the opposite sides of the push-pull circuit to produce a switch action in the tube or transistor. This switching action, being as fast as the tube or transistor will allow, produces a substantially square wave.

Another type of square wave generator or oscillator utilizes transformer feedback and is particularly suited to transformers in a push-pull connection. This is taught in the copending application of Uchrin and Taylor, for "Transistor Oscillator," Serial No. 554,597, filed 21 December 1955, now Patent No. 2,813,976, issued Nov. 19, 1957. This oscillator which will be shown for convenience in Figure 1 of this application consists of a transformer connected in push-pull across two transistors and having positive feedback windings also connected in push-pull to the transistors. This new type of square wave oscillator is controlled by the saturation characteristics of the transformer. Each transistor is fired in turn by the positive feedback and remains conducting until the transformer core is saturated. At this point the transformer voltages including the feedback voltages drop to zero and are momentarily reversed by the decaying flux to trigger the other transistor which in turn conducts until the transformer core is saturated in the opposite direction. At this point the voltage is again reversed and the cycle is repeated.

In the subject invention the saturating core transistor oscillator frequency is controlled by means of a D.-C. bias through one of the transformer coils providing an initial magnetic flux in the core. The degree of saturation due to the D.-C. bias controls the frequency of the square wave oscillator.

It is therefore an object of this invention to provide a means for controlling the frequency of an oscillator.

It is a further object of this invention to provide a means for controlling the frequency of a push-pull transistor oscillator.

It is a further object of this invention to provide a means for controlling the frequency of a push-pull saturating core transistor oscillator.

It is a further object of this invention to provide a D.-C. bias in one of the coils of the saturating core transformer of a transistor oscillator to control the oscillator frequency.

It is a further object of this invention to provide a square wave frequency control.

Figure 2:
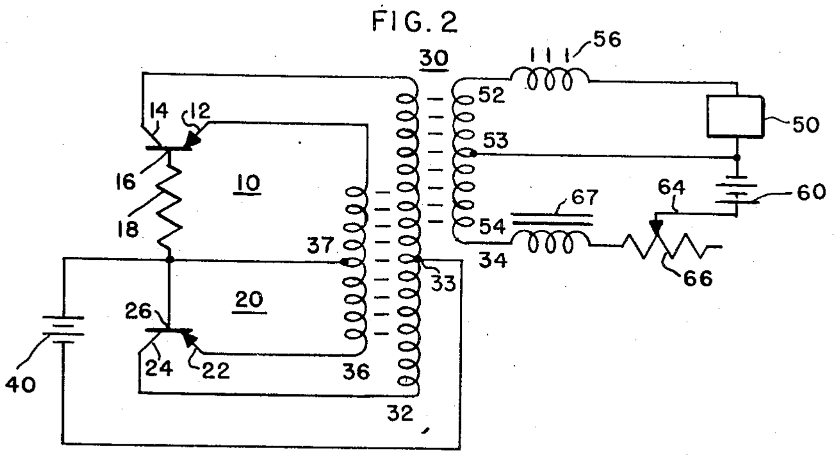

Other and further objects of this invention will become apparent from the following specification and the drawing wherein:

Figure 1 illustrates the basic circuit of a push-pull saturating core transistor oscillator as taught by the prior art, and Figure 2 shows a typical embodiment of this invention for controlling the frequency of a square wave transistor oscillator.

In Figure 1 of the drawings transistors 10 and 20 are coupled to the transformer 30 and source of potential 40. Transistor 10 has emitter electrode 12, collector electrode 14 and base electrode 16. Transistor 20 has emitter electrode 22, collector electrode 24 and base electrode 26. The transformer has a primary winding 32 center tapped at 33, a secondary output winding 34 and a tertiary winding 36 having center tap 37. The base electrodes 16 and 26 are connected together and to the center tap 37 of the tertiary winding and to the positive terminal of the source of potential 40. The collector electrodes 14 and 24 are connected to opposing ends of the primary winding 32. The emitters 12 and 22 are connected to the opposing terminals of the tertiary winding 36. The center tap 33 of the primary winding 32 is connected to the negative terminal of the source of potential 40.

Figure 2 shows a circuit having the same basic components as Figure 1, similarly numbered. The transistors 10 and 20 having emitter, collector, and base electrodes 12, 14, and 16; and 22, 24, and 26 respectively. The transistors have their collectors connected across a primary 32 of the saturating transformer 30. The emitters 12 and 22 are connected across the tertiary winding 36 of transformer 30 and the positive terminal of the power supply 40 is connected to the base electrodes 16 and 26 and to the center tap 37 of the tertiary winding 36. The negative terminal of the battery 40 is connected to the center tap 33 of the primary winding 32. An output winding 34 has terminals 52, 53, and 54. A load impedance 50 is connected in series with a saturable reactor starting device 56 across terminals 52 and 53.

A typical frequency control means according to the teachings of this invention is connected across terminals 53 and 54 of the output winding 34. A source of potential 60 is utilized along with a current controlling resistance 66—which will presumably be variable—and choke 67. These three elements 60, 66, and 67 are connected in series across taps 53 and 54 of the output winding.

A resistance 18 may be included to unbalance one side of the oscillator circuit to insure starting under heavy load.

In operation the source of potential 40 when initially connected across the circuit, will cause conduction through the transistors 10 and 20 and their associated circuitry. Since an absolute symmetry of the elements in this circuit would be almost physically impossible, one side of the circuit including a first transistor energizes itself more than the other to inductively feed back a voltage through the tertiary winding 36 of the transformer to both the control emitters. The transformer is so poled that this further increases the current through the corresponding collector of this first transistor in a first branch of the circuit to further increase the voltage on its emitter which in accumulative effect substantially instantaneously short circuits this first transistor.

Simultaneously the voltage applied by the tertiary winding to the control emitter of the opposite or second transistor drives it to cutoff. The firing of the first transistor produces a leading edge of a square wave of voltage across the output winding 34. The current through the effectively shorted first transistor builds up as fast as the impedance of its circuit constants will allow. This rate of current increase is primarily determined by constants of inductance and resistance of the transformer 30. The constant rate of increase in flux in the transformer core associated with the constant increase in current in the first half of the primary winding induces a constant voltage to form the top of the square wave across the output coil 34.

As soon as the saturation point of the transformer core is reached there can be no further constant increase in flux and all voltages in the transformer return to zero and are driven to the reverse polarity by the decay of flux in the transformer core. This reverse voltage polarity in the second half of the tertiary winding removes the cutoff bias from the emitter of the second transistor and drives it to the conducting region. This starts the collector current flowing through the second half of the primary winding which induces an additional positive feedback across the second half of the tertiary winding to further actuate the control emitter of the second transistor. This cumulative process effectively short circuits the second transistor and cuts off the first transistor in turn, in the same way that the first transistor was shorted and the second transistor cut off at the beginning of the cycle, so that the current steadily builds up through the second transistor half of the transformer. This induces the opposite polarity of the square wave cycle across the output and when the transformer reaches saturation due to the current flowing in the reverse direction, the voltages again reverse and the cycle starts to repeat itself.

Figure 2 functions in the same way as Figure 1 with the transistor connected in substantially the same manner. An output load 50 shown across part of the output winding 34 of the transistor utilizes the square wave generated in this oscillator.

The oscillator is self starting when the load is only about ⅕ of its optimum rated value or lower, but when rated load is applied across the output some type of starting device is necessary to start oscillation. Starting may also be achieved by unbalancing the circuit with an asymmetrical winding in the primary or tertiary coil of the transformer or by inserting an unbalancing element such as a resistance in series with any of the elements in either side of the push-pull circuit. More than one resistance can be used as long as the initial or starting effects do not cancel. A single resistor of about 100 ohms placed in the base circuit of one of the transistors would be a typical example of a starting circuit.

The frequency of this oscillator is primarily dependent on the supply voltage, the number of primary winding turns of the transformer, and the magnetic characteristics of the core material of the transformer. The frequency of the oscillator is given by the formula $$f=\frac{V}{4NB_{\max}A_c10^{-8}}$$

where $f$=frequency in cycles per second
$V$=supply voltage in volts
$N$=number of turns in one side of the primary winding of the transformer
$B_{\max}$=transformer core saturation flux density in lines per square inch
$A_c$=core area in square inches The transformer winding and core materials are normally chosen for a particular frequency with a certain voltage in mind. Once the circuit is completed the frequency can still be controlled to a certain extent by varying the voltage or the transformer characteristics. The transformer characteristics may be varied by changing the ratio of the windings, which would be equivalent to redesigning the transformer, or by applying a load across the transformer which would reflect a different impedance back into the transformer.

A load can obviously be applied across the output winding and this may be the actual load of the square wave oscillator. The change in frequency between no load and the optimum load, might be in the order of 10%. In view of this the normal load of the oscillator must be established before the oscillator frequency is determined.

The control of the output frequency is about 10% between no load and full output load across the output winding but as the load is increased beyond the rated load the frequency change becomes much greater. The overloaded oscillator becomes extremely frequency sensitive with respect to load variations and the oscillation is cut off entirely as the load approaches a direct short circuit.

The load that may be applied to this circuit may be resistive, inductive, or capacitive within the limitations of overload as defined. An additional limitation on an inductive or capacitive load would be that when the load components reach a certain relationship to the inductive components of the transformer an LC tank circuit may be set up that may dominate the load on the transistor and take over the oscillation. This would change the mode of oscillation from square wave to sine wave and cause this circuit to react according to very well known push-pull oscillator techniques wherein the frequency of the oscillator is defined by the LC components of a tank circuit.

A capacitive load would also be limited by the peak current that can be provided by the output winding. Too high a capacity with respect to the frequency of the oscillations would amount to a short circuit.

A simple starting device would be the saturable reactor 56 shown in series with a load 50 whereby a high impedance appears across the load terminals 52 and 53 when the device is starting up. When current starts to flow in the output circuit this reactor will saturate itself to greatly reduce its inductive impedance and to apply practically the full output of 52 and 53 across the load 50.

The saturable reactor starting means would probably be preferable since any distortions which might reflect back into the oscillator would be symmetrical, whereas the unbalance of a transformer coil or transistor circuit would produce asymmetry and would cause an unbalance in the wave form.

The frequency of oscillation of this device may be best controlled by varying the saturation characteristics of the transformer. The saturation characteristics of the transformer may be altered by any initial magnetic influence on the core such as an external source of magnetic flux or a direct current in any one or more of the windings. A practical way of applying direct current to one of the windings is shown with a source of potential 60 connected between taps 53 and 54 of the output windings. The source of potential 60 should include the series connection through a variable resistance 66 and inductor 67. The variable resistance 66 with a tap 64 provides the means for controlling the amount of current flowing through the circuit including part of the winding across 53 and 54.

This current through the transformer winding 34 directly controls the initial saturation characteristics of the transformer 30 and thereby controls the frequency of oscillation of this circuit. As the current flow is increased the frequency will be increased and as the flow of bias current is decreased the frequency of oscillation of the entire circuit is decreased.

A choke or inductor 67 is also put in series with the battery 60 and variable resistor 66. This introduces only a small D.-C. resistance to the circuit while it provides a high A.-C. impedance. The high A.-C. impedance keeps the output current of the oscillator, which will also appear across terminals 53 and 54, from flowing through the battery circuit. The low D.-C. resistance provides a minimum loss of power from the D. C. supply 60.

Since the output winding 34 is electrically isolated from the other windings of the transformer it may have no D.-C. relation with respect to these windings. It can therefore be seen that the supply voltage 40 can also be used in place of the source of potential 60 with the resistor 66 and the number of turns between 53 and 54 being suitably chosen to provide the correct flow of saturating current for the voltage of the source of potential 40. Other D.-C. current connections and means could be incorporated in one or more of the windings or in a spare winding. The initial degree of saturation provided by the battery would reduce the time required for the transformer to reach saturation thereby decreasing the time between oscillations. This would effectively increase the frequency of oscillation. Either polarity of the battery would have the same effect in this example.

In a typical self-excited transistor oscillator constructed in accordance with the principles of the invention as shown in the drawings the source of potential 40 is 45 volts and type X–78 transistors made by the Transistor Products, Inc., are used. The transformer primary winding 32 is about 504 turns of #30 heavy Formex wire, center tapped. The tertiary feedback winding 36 is between 20 and 100 turns of #28 heavy Formex wire, center tapped and the secondary winding 34 is about 3,248 turns of #39 heavy Formex wire with the center tap 53 at 1,624 turns. The core is built of EI–75 laminations of nickel-iron alloy #49 in a ¾" stack. The choke 67 has an inductance of about ½ henry. The resistance 66 has maximum value of about 60,000 ohms and the battery 60 may be of the order of 24 volts. The saturable reactor 56 may be made of 1,000 turns of #39 wire on a 5340–S2 superalloy toroidal core. It is of course to be understood that these values and components are intended by way of illustration only and should not be regarded as limiting the practice of this invention to these parameters.

Other variations of circuit elements will be obvious to those skilled in the art and other types of transistor connections such as common emitter or common collector could as easily be employed within the teachings of this application and those of the art. The opposite polarity of voltage would be used where indicated by the transformer types or connections.

What is claimed is:

1. In a square wave oscillator the combination comprising a pair of substantially identical transistors having emitter, base, and collector electrodes, a transformer having a saturable core and including a center tapped primary winding, a secondary winding and a center tapped tertiary winding, a source of voltage, means connecting said source of voltage through the primary of said transformer to the base-collector electrodes of said transistors in push-pull connection, means connecting said tertiary winding between said base and emitter electrodes in a positive feedback connection, means adapted to connect an external load to the terminals of said secondary winding and a source of magnetic flux adapted to be applied to the core of said transformer to control the frequency of said oscillator.

2. An oscillator as defined in claim 1 wherein said source of magnetic flux comprises a source of potential, a variable resistor, an inductance, and one of said transformer windings connected in series.

3. An osctillator as defined in claim 1 wherein said source of magnetic flux comprises a source of electrical potential and a coil of wire.

4. An oscillator as defined in claim 3 wherein said coil of wire is one of the windings of said transformer.

References Cited in the file of this patent

UNITED STATES PATENTS

| | | |
|---|---|---|
| 2,677,800 | Phillips | May 4, 1954 |
| 2,727,160 | Sunderlin | Dec. 13, 1955 |
| 2,748,274 | Pearlman | May 29, 1956 |
| 2,783,384 | Bright et al. | Feb. 26, 1957 |

FOREIGN PATENTS

| | | |
|---|---|---|
| 684,626 | Great Britain | Dec. 24, 1952 |